(12) United States Patent
Ren et al.

(10) Patent No.: US 12,322,905 B2
(45) Date of Patent: Jun. 3, 2025

(54) PLUGGABLE MODULE (71) Applicant: Huawei Digital Power Technologies Co., Ltd., Shenzhen (CN)

(72) Inventors: Zhanlin Ren, Dongguan (CN); Qianlin Tang, Dongguan (CN); Wei Guo, Dongguan (CN); Xiaoke Ran, Dongguan (CN); Hongbing Wang, Dongguan (CN); Donghai Ma, Dongguan (CN); Xinquan Huang, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 386 days.

(21) Appl. No.: 17/884,941

(22) Filed: Aug. 10, 2022

(65) Prior Publication Data
US 2022/0384994 A1 Dec. 1, 2022

Related U.S. Application Data (63) Continuation of application No. PCT/CN2020/074674, filed on Feb. 10, 2020.

(51) Int. Cl.
*H01R 13/64* (2006.01)
*H01R 13/629* (2006.01)
(Continued)

(52) U.S. Cl.
CPC .......... *H01R 13/64* (2013.01); *H01R 13/629* (2013.01); *H01R 13/639* (2013.01); *H01R 13/68* (2013.01); *H01R 13/70* (2013.01); *H01R 24/76* (2013.01)

(58) Field of Classification Search
CPC .... H01R 13/64; H01R 13/629; H01R 13/639; H01R 13/68; H01R 13/70; H01R 24/76; H05K 7/1414
See application file for complete search history.

(56) References Cited

U.S. PATENT DOCUMENTS 5,989,043 A * 11/1999 Han .................... H05K 7/1414
439/157
6,494,729 B1 * 12/2002 Stathopoulos ....... H01R 13/701
439/372
(Continued)

FOREIGN PATENT DOCUMENTS

CN 101740947 A 6/2010
CN 102005680 A 4/2011
(Continued)

*Primary Examiner* — Edwin A. Leon
(74) *Attorney, Agent, or Firm* — Maier & Maier, PLLC (57) ABSTRACT A pluggable module includes a power control unit, an interface unit, a monitoring unit, and a signal linkage unit. The power control unit is connected to the interface unit, and the pluggable module can be inserted into an external device by using the interface unit. One end of a pull ring is rotatably connected to a bracket, and the other end can trigger a signal switch. When the pull ring is in an ON state, the signal switch is triggered to send a first switch signal, or when the pull ring is in an OFF state, the signal switch sends a second switch signal. The monitoring unit is configured to control, upon receiving the first switch signal, the power control unit to be powered on, or control, upon receiving the second switch signal, the power control unit to be powered off.

20 Claims, 3 Drawing Sheets

(51) Int. Cl.
*H01R 13/639* (2006.01)
*H01R 13/68* (2011.01)
*H01R 13/70* (2006.01)
*H01R 24/76* (2011.01)

(56) References Cited

U.S. PATENT DOCUMENTS

| | | | |
|---|---|---|---|
| 7,284,997 | B2 | 10/2007 | Joist |
| 8,179,680 | B1 | 5/2012 | Lam et al. |
| 8,986,024 | B2 * | 3/2015 | Ikeda ............... H01R 13/62938 200/332 |
| 2002/0057550 | A1 * | 5/2002 | Ulrich ................ H01R 13/7035 361/600 |
| 2015/0012760 | A1 | 1/2015 | Shichi |

FOREIGN PATENT DOCUMENTS

| | | |
|---|---|---|
| CN | 103682994 A | 3/2014 |
| CN | 102573375 B | 1/2015 |
| CN | 102768496 B | 5/2015 |
| CN | 109524845 A | 3/2019 |
| CN | 209071743 U | 7/2019 |
| CN | 209692072 U | 11/2019 |
| EP | 0357308 A2 | 3/1990 |
| WO | 2005013423 A2 | 2/2005 |

\* cited by examiner

PLUGGABLE MODULE

CROSS-REFERENCE TO RELATED APPLICATIONS

This application is a continuation of International Application No. PCT/CN2020/074674, filed on Feb. 10, 2020, the disclosure of which is hereby incorporated by reference in its entirety.

TECHNICAL FIELD

The embodiments relate to the field of communications device technologies, and a pluggable module.

BACKGROUND

With development of 5G power supply technologies, high-power integration of a communication power supply has become a trend. In addition, power modularization is also applied more widely. For example, currently, common modules are a rectifier module, an inverter module, a DC-DC module, and a power distribution module.

Currently, in the communications field, server field, or the like, it is required that no power outage should occur in a power supply device and that a power module should be insusceptible to damage in a plugging or replacement process. Currently, interfaces of power modules mostly use edge connectors or mating connectors to implement plugging and maintenance. At a moment when a power module is inserted into or removed from a connector, because the connector is connected to a system busbar, an electric arc is likely to occur if there is no corresponding hot plugging prevention design for the power module. Consequently, an interface of the power module inserted into the connector may be probably arced or damaged, performance and reliability of the power module are affected, and there is a safety risk in the application of the power module.

SUMMARY

According to a first aspect, a pluggable module may include a power control unit, an interface unit, a monitoring unit, and a signal linkage unit. The power control unit is connected to the interface unit, and the pluggable module is inserted into an external device by using the interface unit. The signal linkage unit includes a bracket, a pull ring, and a signal switch, where one end of the pull ring is rotatably connected to the bracket, and the other end can trigger the signal switch, so that the signal switch generates a switch signal. When the pull ring is in an ON state, the signal switch is triggered to send a first switch signal, or when the pull ring is in an OFF state, the signal switch sends a second switch signal. The monitoring unit is connected to the power control unit and the signal linkage unit, and is configured to control, upon receiving the first switch signal, the power control unit to be powered on, or control, upon receiving the second switch signal, the power control unit to be powered off.

When the pluggable module in this embodiment is inserted into the external device, after the pluggable module is mounted into the external device, the pull ring of the signal linkage unit may be pressed, so that the pull ring is in the ON state. Therefore, the signal switch is triggered to send the first switch signal, and the first switch signal (turn-on signal or turn-off signal) is transmitted to the monitoring unit. Upon receiving the first switch signal, the monitoring unit controls a contactor or a relay of the power control unit to be powered on, so that the pluggable module can be prevented from sparking.

In addition, when the pluggable module is removed from the external device, the pull ring of the signal linkage unit may be pulled, so that the pull ring is in the OFF state. Therefore, the signal switch sends the second switch signal, and the second switch signal (turn-off signal or turn-on signal) is transmitted to the monitoring unit. Then upon receiving the second switch signal, the monitoring unit disconnects each contactor or relay of the power control unit to power off a circuit load. Finally, the pluggable module can be removed in a power-off state. In this way, the interface unit is prevented from being arced or damaged when the pluggable module is removed.

In a possible implementation, the signal linkage unit may further include a pin, and a slot may be further disposed on the pull ring. Therefore, when the pull ring is in the ON state, the pin can be inserted into the slot, thereby locking the pull ring. This prevents the pull ring from falling out and effectively reduces a misoperation possibility. When the pull ring is in the ON state, the module is mechanically locked and cannot be removed. When the pull ring is in the OFF state, the module is unlocked, and the module can be removed by pulling the pull ring.

In a possible implementation, a socket may be further disposed on the bracket, and the pin may be inserted into the socket. In this way, the pin can be inserted into the socket after passing through the slot, thereby locking the pull ring to the bracket to avoid rotating of the pull ring around the bracket.

In a possible implementation, the signal linkage unit further includes a damping mechanism, a first gear structure and a second gear structure that can be engaged with the damping mechanism are disposed on the pull ring, and the first gear structure and the second gear structure are sequentially disposed along a direction away from a support base; and when the second gear structure is engaged with the damping mechanism, the pull ring is in the ON state, and the pull ring triggers the signal switch to send the first switch signal; or when the second gear structure is disengaged from the damping mechanism, the signal switch sends the second switch signal.

Because switching of the damping mechanism between the first gear structure and the second gear structure can be implemented in the process of pressing and pulling the pull ring, switching between the first switch signal and the second switch signal is implemented. In this way, an operation time can be increased to ensure that each circuit of the power control unit has been powered off when the pluggable module is removed. Then when a finger is put into the pull ring to remove the pluggable module, because the power control unit has been completely powered off, the interface unit of the pluggable module can be prevented from sparking, and reliability of hot plugging prevention protection is improved.

In a possible implementation, the signal linkage unit further includes a damping mechanism, a first gear structure and a second gear structure that can be engaged with the damping mechanism are disposed on the pull ring, and the first gear structure and the second gear structure are sequentially disposed along a direction away from a support base; a slot is further disposed on the pull ring, and the second gear structure is located between the first gear structure and the slot; and when the pull ring is in the ON state, a pin can be inserted into the slot, the damping mechanism is located on one side of the second gear structure away from the first gear structure, and a distance exists between the damping mechanism and the second gear structure; and when the pin is removed from the slot, the pull ring rotates around the bracket, and the signal switch sends the second switch signal.

In the pluggable module in this embodiment, because the pin is disposed on the signal linkage unit, in the process of connecting the pluggable module to the external device, when the pull ring is switched from a state in which the first gear structure is engaged with the damping mechanism to a state in which the second gear structure is engaged with the damping mechanism, the power control unit can be still in the power-off state. The pull ring is in the ON state only when the pin is inserted into the slot, to trigger the signal switch to send the first switch signal. Therefore, upon receiving the first switch signal, the monitoring unit controls the power control unit to be powered on.

In addition, when the pluggable module is removed from the external device, the pull ring may be caused to rotate around the bracket without external force when the pin is removed from the slot, so that the signal switch sends the second switch signal, and upon receiving the second switch signal, the monitoring unit controls the power control unit to be powered off. In addition, the power control unit has been powered off when the second gear structure is engaged with the damping mechanism. However, in this case, the pull ring may be pulled, so that the operation time is increased in the process of switching the pull ring from the state in which the second gear structure is engaged with the damping mechanism to the state in which the first gear structure is engaged with the damping mechanism, to ensure that each circuit of the power control unit has been powered off when the pluggable module is removed. Then when a finger is put into the pull ring to remove the pluggable module, because the power control unit has been completely powered off, the interface unit of the pluggable module can be prevented from sparking, and reliability of hot plugging prevention protection is improved.

In a possible implementation, the signal linkage unit further includes the support base. In this case, the damping mechanism may be disposed between the bracket and the support base, and the damping mechanism may be fastened to the support base. In this way, the support base can function as a support for the damping mechanism.

In a possible implementation, when the signal switch is disposed, alternatively, the signal switch may be disposed on the support base, and the signal switch may be, but is not limited to, a micro switch, a rocker switch, a membrane switch, or a magnetic switch. When the signal switch is a micro switch, the micro switch may include a spring, so that the spring can be attached to the support base under action of the pull ring to send the first switch signal.

In a possible implementation, the pluggable module may further include an input/output unit, and the input/output unit may be a circuit breaker, a connector, a fuse, or the like. The monitoring unit may be further connected to the input/output unit and configured to control the input/output unit to input or output a signal.

In a possible implementation, when the input/output unit is disposed, the input/output unit may be disposed at one end of the pluggable module opposite to the interface unit.

In addition, a handle may be further disposed on the pluggable module, and the handle and the signal linkage unit may be separately disposed on two sides of the input/output unit. In this way, when a plugging operation is performed on the pluggable module, the handle and the pull ring of the signal linkage unit can be respectively held with both hands, thereby improving operation convenience.

According to a second aspect, a power supply system includes a power busbar and the pluggable module according to the first aspect. The pluggable module is pluggable to the power busbar by using the interface unit.

By using the power supply system, when the pluggable module is inserted into the power busbar, after the pluggable module is mounted into the power busbar, the pull ring of the signal linkage unit may be pressed, so that the pull ring is in the ON state. Therefore, the signal switch is triggered to send the first switch signal, and the first switch signal (turn-on signal or turn-off signal) is transmitted to the monitoring unit. Upon receiving the first switch signal, the monitoring unit controls the contactor or the relay of the power control unit to be powered on, so that the pluggable module can be prevented from sparking.

In addition, when the pluggable module is removed from the power busbar, the pull ring of the signal linkage unit may be pulled, so that the pull ring is in the OFF state. Therefore, the signal switch sends the second switch signal, and the second switch signal (turn-off signal or turn-on signal) is transmitted to the monitoring unit. Then upon receiving the second switch signal, the monitoring unit disconnects each contactor or relay of the power control unit to power off the circuit load. Finally, the pluggable module can be removed in the power-off state. In this way, the interface unit is prevented from being arced or damaged when the pluggable module is removed.

DETAILED DESCRIPTION OF THE EMBODIMENTS

To make objectives, solutions, and advantages clearer, the following further describes the embodiments in detail with reference to the accompanying drawings.

For ease of understanding of a pluggable module provided in an embodiment, the following first describes a scenario of the pluggable module. The pluggable module provided in this embodiment may be, but is not limited to, a power module, provided that the pluggable module can be applied to a power supply system. Therefore, when the pluggable module is inserted into or removed from a power busbar in the power supply system, hot plugging prevention protection can be implemented. The power module may be, for example, a direct current module, an alternating current module, or an inverter module. In addition, in some external pluggable intelligent power distribution devices, hot plugging prevention may also be designed with reference to the pluggable module, so that hot plugging prevention protection can be performed in an external intelligent power distribution device such as an intelligent pluggable fuse, a circuit breaker, or a connector.

Figure 1:
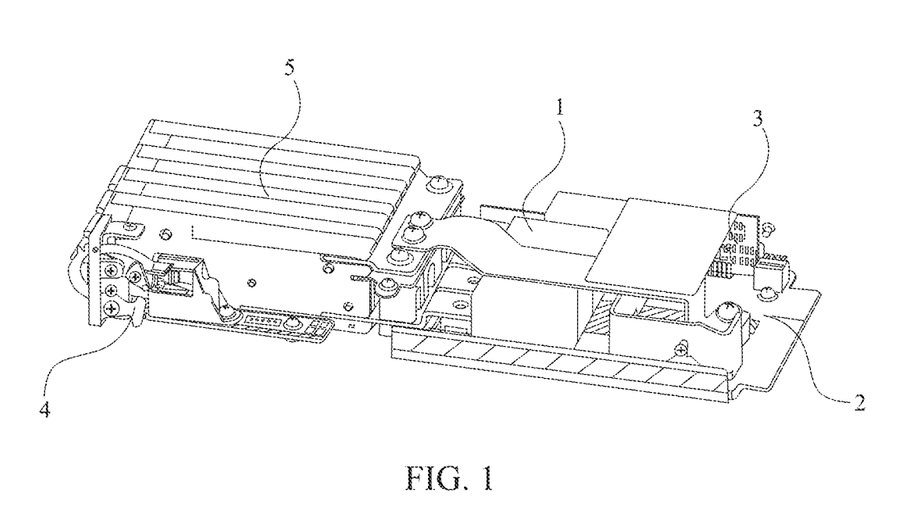
FIG. 1 is a schematic diagram of a structure of a pluggable module according to an embodiment.

FIG. 1 is a schematic diagram of an overall structure of a pluggable module. The pluggable module provided in this embodiment includes a power control unit 1, an interface unit 2, a monitoring unit 3, and a signal linkage unit 4. The signal linkage unit 4 may have a plurality of implementations. For example, an implementation is a linkage between a pull ring with a damper and a micro switch, or a linkage between another structure and a state switch. The power control unit 1 may be, but is not limited to, a contactor, a relay, or the like. The interface unit 2 may be, but is not limited to, an edge connector, a male/female mating connector, or the like, and is used as a connection port for connecting the pluggable module to another external device.

Still referring to FIG. 1, the pluggable module in this embodiment may further include an input/output unit 5, in addition to the foregoing structure. The input/output unit 5 is not limited to a circuit breaker, a connector, a fuse, or the like.

When the pluggable module is used, for ease of understanding, in the description of the following embodiments, it is assumed that an external device into which the pluggable module is inserted is a connector. It may be understood that, when the external device into which the pluggable module is inserted is another external device different from the connector, the pluggable module is inserted or removed in a similar manner. Details are not described.

Figure 2:
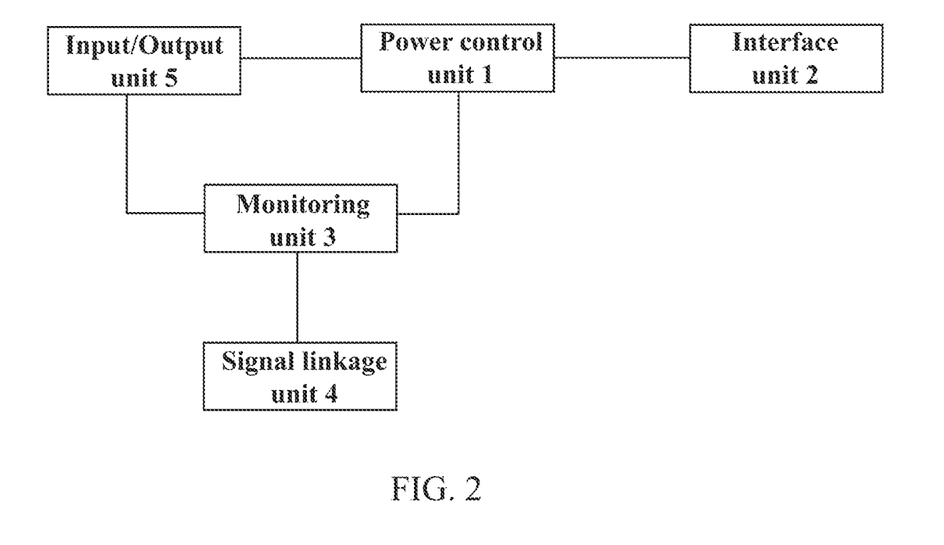
FIG. 2 is a schematic diagram for preventing hot plugging of a pluggable module according to an embodiment.

FIG. 2 is a block diagram of the pluggable module. Before the pluggable module in this embodiment is inserted into the connector, the pluggable module may be in a state without any load. Therefore, after the pluggable module is mounted into the connector, the signal linkage unit 4 may transmit a first switch signal (turn-on signal or turn-off signal) to the monitoring unit 3. Upon receiving the first switch signal, the monitoring unit 3 controls the contactor or a relay of the power control unit 1 to be powered on, so that the pluggable module can be prevented from sparking.

In addition, when the pluggable module is removed from the connector, the signal linkage unit 4 may first transmit a second switch signal (turn-off signal or turn-on signal) to the monitoring unit 3. Then upon receiving the second switch signal, the monitoring unit 3 disconnects each contactor or relay of the power control unit 1 to power off a circuit load. Finally, the pluggable module can be removed in a power-off state. In this way, the interface unit 2 is prevented from being arced or damaged when the pluggable module is removed.

Still referring to FIG. 2, when the pluggable module in this embodiment further includes the input/output unit 5, the monitoring unit 3 may be further connected to the input/output unit 5, to control the input/output unit 5 to input or output a signal.

Still referring to FIG. 1, in this embodiment, the signal linkage unit 4 may be disposed at one end of the pluggable module away from the interface unit 2, so that generation of a switch signal can be triggered in time by using the signal linkage unit 4; and a user can insert the pluggable module into the connector or remove the pluggable module from the connector by pressing or pulling the signal linkage unit 4.

With reference to FIG. 1 and FIG. 2, it can be understood from analysis of the operating principle and the overall structure of the pluggable module in the foregoing embodiments that the signal linkage unit 4 plays a key role in implementing hot plugging prevention protection of the pluggable module. Next, a structure of the signal linkage unit 4 and the triggering and transmission of the switch signal are described in detail with reference to the accompanying drawings.

Figure 3:
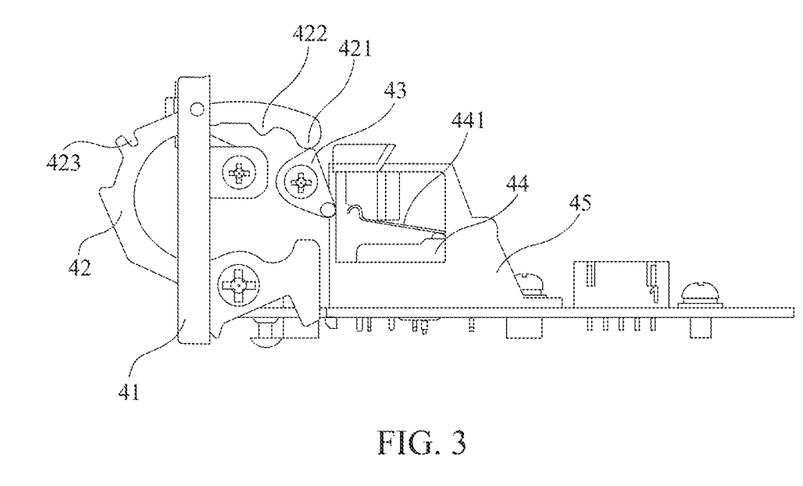
FIG. 3 is a schematic diagram of a structure of a signal linkage unit according to an embodiment.

FIG. 3 is a schematic diagram of a structure of the signal linkage unit 4 according to an embodiment. The signal linkage unit 4 may include, but is not limited to, a bracket 41, a pull ring 42, a damping mechanism 43, a signal switch 44, and a support base 45. The damping mechanism 43 is disposed between the pull ring 42 and the support base 45, and the damping mechanism 43 is fixedly connected to the support base 45. In this embodiment, the signal switch 44 may be, but is not limited to, a micro switch, a rocker switch, a membrane switch, a magnetic switch, a photoelectric switch, or the like.

Still referring to FIG. 3, when the pull ring 42 is disposed, the pull ring 42 may be, but is not limited to, an open annular structure. One end of the pull ring 42 is rotatably connected to the bracket 41, and the other end of the pull ring 42 may extend to the support base 45 in a rotation process of the pull ring 42.

In addition, a first gear structure 421 and a second gear structure 422 may be disposed on the pull ring 42, and the first gear structure 421 and the second gear structure 422 are sequentially disposed along a direction away from the support base 45. In addition, both the first gear structure 421 and the second gear structure 422 can be engaged with the damping mechanism 43.

When the pluggable module in this embodiment needs to be inserted into the connector, the user may hold the pull ring 42 to align the interface unit 2 of the pluggable module with a connection port of the connector, and press the pull ring 42, to connect the pluggable module to the connector. When the pluggable module is inserted into the connector, the second gear structure 422 of the pull ring 42 is engaged with the damping mechanism 43. When removing the pluggable module inserted into the connector, the user may pull the pull ring 42, so that the first gear structure 421 of the pull ring 42 is engaged with the damping mechanism 43. The user may continue to pull the pull ring 42 to remove the pluggable module from the connector.

In addition, for ease of description, referring to FIG. 3, in this embodiment, triggering of a switch signal of the signal linkage unit 4 is described by using an example in which the signal switch 44 is a micro switch. It may be understood that when the signal switch 44 is a switch of another type, a triggering manner thereof is similar, and details are not described.

When the signal switch 44 is disposed, the signal switch 44 may be disposed on the support base 45. When the signal switch 44 is a micro switch, the micro switch includes a spring 441. The spring 441 is disposed on the support base 45, and one end of the pull ring 42 that can extend to the support base 45 may be in contact with the micro switch. In this way, when the pull ring 42 is pressed or pulled, the pull ring 42 may drive the spring 441 to act to trigger turn-off or turn-on of the micro switch, to send a turn-off signal or a turn-on signal to the monitoring unit 3.

Figure 4:
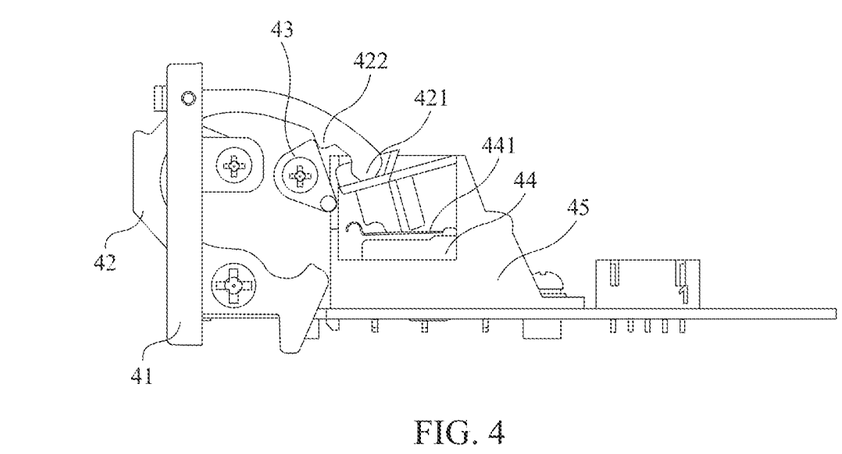
FIG. 4 is a schematic diagram of a structure of a signal linkage mechanism in a pluggable module in an inserted state according to an embodiment.

FIG. 4 is a schematic diagram of a structure of the signal linkage mechanism in the pluggable module in a state of being inserted into the connector according to an embodiment. As shown in FIG. 4, in this embodiment, when the pluggable module is in the state of being inserted into the connector, the second gear structure 422 of the pull ring 42 of the signal linkage mechanism is engaged with the damping mechanism 43, and the pull ring 42 is in an ON state. The spring 441 of the microstructure is in a pressed state under action of the pull ring 42, and the spring 441 is attached to the support base 45. In this embodiment, a state in which the spring 441 is attached to the support base 45 is set as an ON state of the micro switch, and a state in which the spring 441 bounces up is set as an OFF state of the micro switch. Correspondingly, when the micro switch is in the ON state, the monitoring unit 3 receives the turn-on signal, thereby controlling the power control unit 1 to be powered on; or when the micro switch is in the OFF state, the monitoring unit 3 receives the turn-off signal, thereby controlling the power control unit 1 to be powered off. In another possible embodiment, alternatively, when the micro switch is in the ON state, the monitoring unit 3 may receive the turn-on signal, thereby controlling the power control unit 1 to be powered off; or when the micro switch is in the OFF state, the monitoring unit 3 receives the turn-off signal, thereby controlling the power control unit 1 to be powered on. A corresponding setting manner may be selected for the monitoring unit 3 based on a requirement.

It may be understood that, due to presence of the damping mechanism 43, when the pull ring 42 is not externally pulled, the pull ring 42 is not switched from a state in which the second gear structure 422 is engaged with the damping mechanism 43 to a state in which the first gear structure 421 is engaged with the damping mechanism 43.

Figure 5:
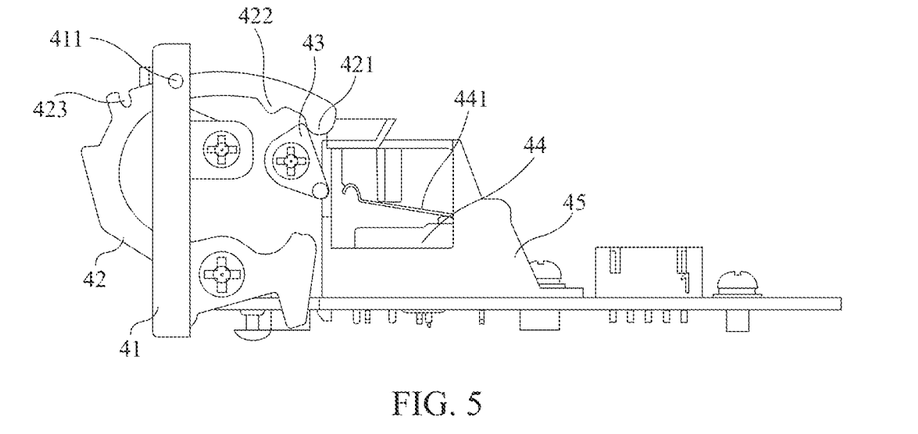
FIG. 5 is a schematic diagram of a structure of a signal linkage mechanism in a pluggable module in a non-inserted state according to an embodiment.

When the pluggable module in this embodiment is removed from the connector, operation steps may be as follows: First, the pull ring 42 of the signal linkage mechanism is pulled, so that the pull ring 42 is switched from the state in which the second gear structure 422 is engaged with the damping mechanism 43, as shown in FIG. 4, to the state in which the first gear structure 421 is engaged with the damping mechanism 43, as shown in FIG. 5. In this process, the pull ring 42 is in an OFF state, and the spring 441 of the micro switch bounces up with the pull ring 42, so that the micro switch is switched from the ON state to the OFF state. Then the monitoring unit 3 receives the turn-off signal, thereby controlling the power control unit 1 to be powered off. Finally, the pull ring 42 is pulled continuously, so that the pluggable module is detached from the connector.

Generally, when there is a plurality of electrical signal circuits in the power control unit 1, and when the power control unit 1 is powered off, the plurality of electrical signal circuits may be powered off simultaneously or may be powered off sequentially. In this embodiment, due to presence of the first gear structure 421 and the second gear structure 422 on the pull ring 42, an operation time can be increased in the process of switching the pull ring 42 from the state in which the second gear structure 422 is engaged with the damping mechanism 43 to the state in which the first gear structure 421 is engaged with the damping mechanism 43, to ensure that power-off has been completed when the pluggable module is removed. In this way, when a finger is put into the pull ring 42 to remove the pluggable module, because the power control unit 1 has been powered off, the interface unit 2 of the pluggable module can be prevented from sparking.

Figure 6:
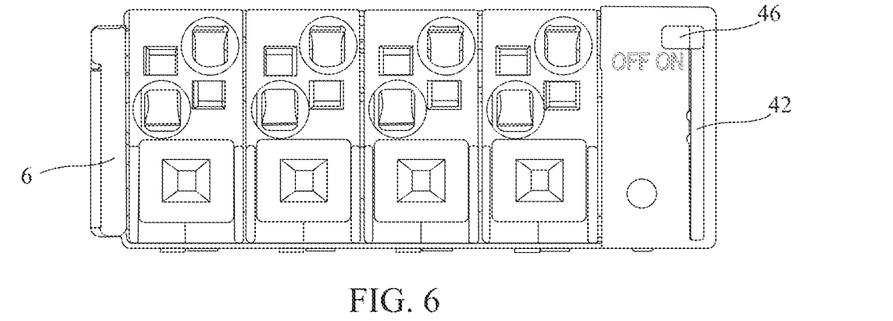
FIG. 6 is a schematic diagram of a structure of a pluggable module according to another embodiment.

In addition, referring to FIG. 6, a pin 46 may be further disposed in the pluggable module in this embodiment. Moreover, a slot 423 may be further disposed on the signal linkage mechanism (refer to FIG. 5). Referring to FIG. 4 and FIG. 6, when the pluggable module is in the state of being inserted into the connector, the pin 46 may be correspondingly inserted into the slot 423 (the pin 46 in FIG. 6 is in an ON position) to implement position locking of the pull ring 42. In addition, referring to FIG. 5, a socket 411 may be further disposed on the bracket 41, so that the pin 46 is inserted into the socket 411 after passing through the slot 423 and that the pull ring 42 is locked to the bracket 41. In this way, reliability of the engagement between the second gear structure 422 of the pull ring 42 and the damping mechanism 43 can be effectively improved, to implement stable working of the pluggable module. In addition, a user misoperation possibility can be effectively reduced.

Still referring to FIG. 6, in this embodiment, when the pin 46 is disposed in the pluggable module, when the pin 46 is inserted into the slot 423, the spring 441 of the micro switch may be attached to the support base 45, so that the micro switch is in the ON state. In this case, the damping mechanism 43 may be located on one side of the second gear structure 422 away from the first gear structure 421, and a distance exists between the damping mechanism 43 and the second gear structure 422.

In addition, when the pin 46 is removed from the slot 423 (the pin 46 is in an OFF position), the pull ring 42 may be released. In this case, the pull ring 42 rotates around the bracket 41 without external force, the spring 441 of the micro switch bounces up, and the micro switch is switched from the ON state to the OFF state. Upon receiving a turn-off signal, the monitoring unit 3 controls the power control unit 1 to be powered off.

It may be understood that, due to presence of the damping mechanism 43, when the pull ring 42 rotates at an angle, the second gear structure 422 is engaged with the damping mechanism 43, thereby stopping movement of the pull ring 42. In this case, the pull ring 42 may be pulled, so that the pull ring 42 is switched from the state in which the second gear structure 422 is engaged with the damping mechanism 43, as shown in FIG. 4, to the state in which the first gear structure 421 is engaged with the damping mechanism 43, as shown in FIG. 5, and the pluggable module may be removed from the connector by continuing to pull the pull ring 42.

In the foregoing process, because the pin 46 is disposed, when the pin 46 is removed from the slot 423, the pull ring 42 rotates around the bracket 41 without external force. Therefore, the spring 441 bounces up to turn off the micro switch. Upon receiving a turn-off signal, the monitoring unit 3 controls the power control unit 1 to be powered off. In addition, the power control unit 1 has been powered off when the second gear structure 422 is engaged with the damping mechanism 43. However, in this case, the pull ring 42 may be pulled, so that the operation time is increased in the process of switching the pull ring 42 from the state in which the second gear structure 422 is engaged with the damping mechanism 43 to the state in which the first gear structure 421 is engaged with the damping mechanism 43, to ensure that each circuit of the power control unit 1 has been powered off when the pluggable module is removed. Then when a finger is put into the pull ring 42 to remove the pluggable module, because the power control unit 1 has been completely powered off, the interface unit 2 of the pluggable module can be prevented from sparking, and reliability of hot plugging prevention protection is improved.

The process of removing the pluggable module from the connector and a function of the signal linkage unit 4 for hot plugging prevention protection in the removal process are described in the foregoing embodiment. Next, a function of the signal linkage unit 4 for hot plugging prevention protection in a process of inserting the pluggable module into the connector is described with reference to the accompanying drawings.

FIG. 5 is a schematic diagram of a structure of the signal linkage unit 4 in the pluggable module in a state of not being inserted into the connector according to an embodiment. In this case, if the pluggable module needs to be connected to the connector, operation steps may be as follows: First, the pull ring 42 is held, so that the interface unit 2 is aligned with the connection port of the connector. Then the pull ring 42 of the pluggable module is pressed, so that the pluggable module is inserted into the connector. In addition, in the process of pressing the pull ring 42, the pull ring 42 is switched from the state in which the first gear structure 421 is engaged with the damping mechanism 43, as shown in FIG. 5, to the state in which the second gear structure 422 is engaged with the damping mechanism 43, as shown in FIG. 4. In the state in FIG. 4, the spring 441 of the micro switch is firmly pressed against the support base 45 by the pull ring 42, and the micro switch is switched from the OFF state to the ON state. Finally, the monitoring unit 3 receives a turn-on signal, thereby controlling the power control unit 1 to be powered on.

In the process of inserting the pluggable module into the connector, the power control unit 1 of the pluggable module is not energized, and the spring 441 is attached to the support base 45 to power on the power control unit 1 only after the pluggable module is inserted into the connector. In this way, the interface unit 2 of the pluggable module can be prevented from being arced or damaged.

In addition, referring to FIG. 6, when the pin 46 is further disposed in the pluggable module in this embodiment, after the pluggable module is inserted into the connector, in the state in which the second gear structure 422 of the pull ring 42 is engaged with the damping mechanism 43, the pin 46 is correspondingly inserted into the slot 423 (as shown in FIG. 6, the pin 46 is in the ON position), so that the pull ring 42 is locked to the bracket 41. This can prevent the pull ring 42 from falling out and effectively reduce a misoperation possibility.

In this embodiment, when the pin 46 is disposed in the pluggable module, the spring 441 may be still in a state of bouncing up when the second gear structure 422 of the pull ring 42 is engaged with the damping mechanism 43, so that the power control unit 1 is still in the power-off state. In this case, the pull ring 42 is pressed continuously, so that the damping mechanism 43 is located on one side of the second gear structure 422 away from the first gear structure 421, and a distance exists between the damping mechanism 43 and the second gear structure 422. The spring 441 of the micro switch can be attached to the support base 45 only when the pin 46 can be inserted into the slot 423, so that the micro switch is switched from the OFF state to the ON state. Upon receiving a turn-on signal, the monitoring unit 3 controls the power control unit 1 to be powered on.

In the foregoing process, because the pin 46 is disposed, in the process of connecting the pluggable module and the connector, when the pull ring 42 is switched from the state in which the first gear structure 421 is engaged with the damping mechanism 43 to the state in which the second gear structure 422 is engaged with the damping mechanism 43, the power control unit 1 may be still in the power-off state. The spring 441 can be attached to the support base 45 only when the pin 46 is inserted into the slot 423. Therefore, upon receiving the turn-on signal, the monitoring unit 3 controls the power control unit 1 to be powered on. In this way, an operation time for connecting the pluggable module to the connector can be effectively increased, and the power control unit 1 can be powered on only after the pluggable module is inserted into the connector. Therefore, the interface unit 2 of the pluggable module can be prevented from sparking, and reliability of hot plugging prevention protection is improved.

Figure 7:
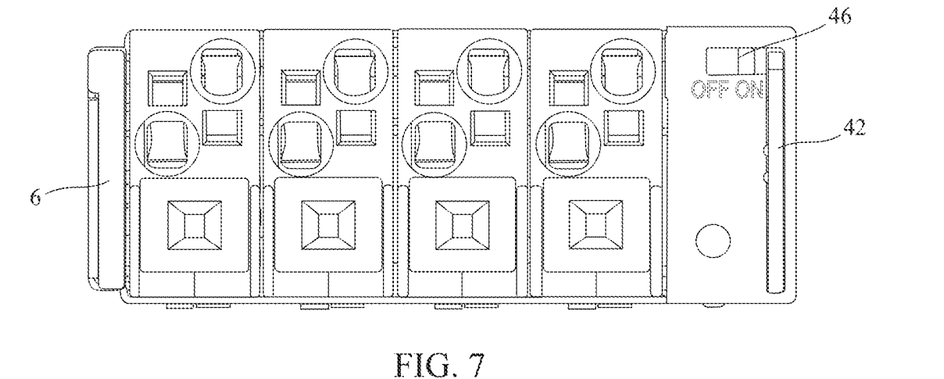
FIG. 7 is a schematic diagram of a structure of a pluggable module according to another embodiment.

In addition, referring to FIG. 6 or FIG. 7, in some embodiments, a handle 6 may be further disposed on the pluggable module, or the handle 6 may be disposed at one end of the pluggable module opposite to the signal linkage mechanism. In this way, when a plugging operation is performed on the pluggable module, the handle 6 and the pull ring 42 of the signal linkage mechanism can be respectively held with both hands, thereby improving operation convenience.

A person skilled in the art can make various modifications and variations without departing from the scope of the embodiments.

What is claimed is:

1. A pluggable module, comprising:
    a power control unit;
    an interface unit;
    a monitoring unit; and
    a signal linkage unit comprising a bracket, a pull ring having an open section and plurality of gear structures, a signal switch and a damping mechanism, wherein the power control unit is connected to the interface unit, the pluggable module is inserted into an external device by using the interface unit, one end of the pull ring is rotatably connected to the bracket, the other end is configured to trigger the signal switch, and
    when the pull ring is in an ON state, the signal switch is triggered to send a first switch signal, or
    when the pull ring is in an OFF state, the signal switch sends a second switch signal; and the monitoring unit is connected to the power control unit and the signal linkage unit, and is configured to control, upon receiving the first switch signal, the power control unit to be powered on, or control, upon receiving the second switch signal, the power control unit to be powered off.

2. The pluggable module according to claim 1, further comprising:
    a pin, and a slot is further disposed on the pull ring; and when the pull ring is in the ON state, the pin can be inserted into the slot.

3. The pluggable module according to claim 2, wherein a socket is disposed on the bracket, and the pin can be inserted into the socket.

4. The pluggable module according to claim 1, wherein the signal linkage unit further comprises:
    the plurality of gear structures have a first gear structure, and
    a second gear structure that can be engaged with the damping mechanism, and the first gear structure and the second gear structure are sequentially disposed along a direction away from a support base; and
    when the second gear structure is engaged with the damping mechanism, the pull ring is in the ON state, and the pull ring triggers the signal switch to send the first switch signal; or when the second gear structure is disengaged from the damping mechanism, the signal switch sends the second switch signal.

5. The pluggable module according to claim 2, wherein the signal linkage unit further comprises:
    the plurality of gear structures have a first gear structure, and
    a second gear structure that can be engaged with the damping mechanism, and the first gear structure and the second gear structure are sequentially disposed along a direction away from a support base; and
    when the second gear structure is engaged with the damping mechanism, the pull ring is in the ON state, and the pull ring triggers the signal switch to send the first switch signal; or when the second gear structure is disengaged from the damping mechanism, the signal switch sends the second switch signal.

6. The pluggable module according to claim 1, wherein the signal linkage unit further comprises:
   the plurality of gear structures have a first gear structure, and
   a second gear structure that can be engaged with the damping mechanism, and the first gear structure and the second gear structure are sequentially disposed along a direction away from a support base; a slot is further disposed on the pull ring, and the second gear structure is located between the first gear structure and the slot; and
   the pluggable module further comprises a pin, and when the pull ring is in the ON state, the pin can be inserted into the slot, the damping mechanism is located on one side of the second gear structure away from the first gear structure, and a distance exists between the damping mechanism and the second gear structure; and when the pin is removed from the slot, the pull ring rotates around the bracket, and the signal switch sends the second switch signal.

7. The pluggable module according to claim 4, wherein the signal linkage unit further comprises:
   a support base, the damping mechanism is disposed between the bracket and the support base, and the damping mechanism is fastened to the support base.

8. The pluggable module according to claim 6, wherein the signal linkage unit further comprises the support base, the damping mechanism is disposed between the bracket and the support base, and the damping mechanism is fastened to the support base.

9. The pluggable module according to claim 1, wherein the signal switch is disposed on a support base.

10. The pluggable module according to claim 1, wherein the signal switch is a micro switch, a rocker switch, a membrane switch, a magnetic switch, or a photoelectric switch.

11. The pluggable module according to claim 10, wherein the signal switch is the micro switch, the micro switch comprises a spring, and when the signal linkage unit further comprises a support base, the spring is attached to the support base to send the first switch signal.

12. The pluggable module according to claim 1, wherein the pluggable module further comprises:
   an input/output unit, and the monitoring unit is further connected to the input/output unit and configured to control the input/output unit to input or output a signal.

13. The pluggable module according to claim 12, wherein the input/output unit is disposed at one end of the pluggable module opposite to the interface unit; and the pluggable module further comprises a handle, and the handle and the signal linkage unit are separately disposed on two sides of the input/output unit.

14. The pluggable module according to claim 12, wherein the input/output unit is a circuit breaker, a connector, or a fuse.

15. A power supply system, comprising:
   a power busbar; and
   a pluggable module comprising
      a power control unit,
      an interface unit,
      a monitoring unit, and
      a signal linkage unit comprising a bracket, a pull ring, having an open section and plurality of gear structures, a signal switch and a damping mechanism, wherein the power control unit is connected to the interface unit, and the pluggable module is inserted into an external device by using the interface unit, one end of the pull ring is rotatably connected to the bracket, the other end is configured to trigger the signal switch, and
      when the pull ring is in an ON state, the signal switch is triggered to send a first switch signal, or
      when the pull ring is in an OFF state, the signal switch sends a second switch signal; and the monitoring unit is connected to the power control unit and the signal linkage unit, and is configured to control, upon receiving the first switch signal, the power control unit to be powered on, or control, upon receiving the second switch signal, the power control unit to be powered off; wherein the pluggable module is pluggable to the power busbar.

16. The power supply system according to claim 15, wherein the pluggable module further comprises:
   a pin, and a slot is further disposed on the pull ring; and
   when the pull ring is in the ON state, the pin can be inserted into the slot.

17. The power supply system according to claim 16, wherein a socket is disposed on the bracket, and the pin can be inserted into the socket.

18. The pluggable module according to claim 15, wherein the signal linkage unit further comprises:
   the plurality of gear structures having a first gear structure, and
   a second gear structure that can be engaged with the damping mechanism, and the first gear structure and the second gear structure are sequentially disposed along a direction away from a support base; a slot is further disposed on the pull ring, and the second gear structure is located between the first gear structure and the slot.

19. The pluggable module according to claim 15, wherein the pluggable module further comprises a pin, and when the pull ring is in the ON state, the pin can be inserted into the slot, the damping mechanism is located on one side of the second gear structure away from the first gear structure, and a distance exists between the damping mechanism and the second gear structure; and when the pin is removed from the slot, the pull ring rotates around the bracket, and the signal switch sends the second switch signal.

20. The pluggable module according to claim 15, wherein the signal linkage unit further comprises:
   a support base, the damping mechanism is disposed between the bracket and the support base, and the damping mechanism is fastened to the support base.

* * * * *

UNITED STATES PATENT AND TRADEMARK OFFICE
CERTIFICATE OF CORRECTION

PATENT NO. : 12,322,905 B2
APPLICATION NO. : 17/884941
DATED : June 3, 2025
INVENTOR(S) : Zhanlin Ren et al.

Page 1 of 1

It is certified that error appears in the above-identified patent and that said Letters Patent is hereby corrected as shown below:

In the Claims

Column 12, Claim 15, Line 7, should read "a signal linkage unit comprising a bracket, a pull ring"

Signed and Sealed this
Nineteenth Day of August, 2025

Coke Morgan Stewart
*Acting Director of the United States Patent and Trademark Office*